United States Patent [19]

Ross

[11] Patent Number: 4,798,649

[45] Date of Patent: Jan. 17, 1989

[54] DISCRETE STRIP TAPER

[75] Inventor: John P. Ross, Cupertino, Calif.

[73] Assignee: National Semiconductor Corporation, Santa Clara, Calif.

[21] Appl. No.: 685,609

[22] Filed: Dec. 28, 1984

Related U.S. Application Data

[63] Continuation of Ser. No. 463,790, Feb. 4, 1983, abandoned.

[51] Int. Cl.⁴ .............................................. B32B 31/00
[52] U.S. Cl. ..................................... 156/552; 226/64; 226/67; 226/68; 271/267
[58] Field of Search ........................................ 226/71–73, 226/62–64, 67; 156/355, 518, 552, 556; 271/84, 267

[56] References Cited

U.S. PATENT DOCUMENTS

| 2,449,693 | 9/1948 | Fairbanks | 226/73 X |
| 2,712,771 | 7/1955 | Isom | 226/71 |
| 3,576,429 | 4/1971 | Thauland | 271/267 X |
| 3,892,618 | 7/1975 | Griebat | 156/355 |
| 4,193,834 | 3/1980 | Bernardi | 226/67 X |
| 4,279,682 | 7/1981 | Hamagami et al. | 156/518 |

Primary Examiner—David Simmons
Attorney, Agent, or Firm—Gail W. Woodward; Lee Patch; Mark Aaker

[57] ABSTRACT

A feed mechanism for a tape applying machine in the semiconductor lead frame arts, especially suitable for discrete pieces of lead frame, in which pins are inserted into holes in the lead frame and advanced periodically. The pins are deliberately made smaller than the holes and moved in such a way as to always return to the center of the holes, well clear of the edges, before entering or withdrawing from the holes.

6 Claims, 1 Drawing Sheet

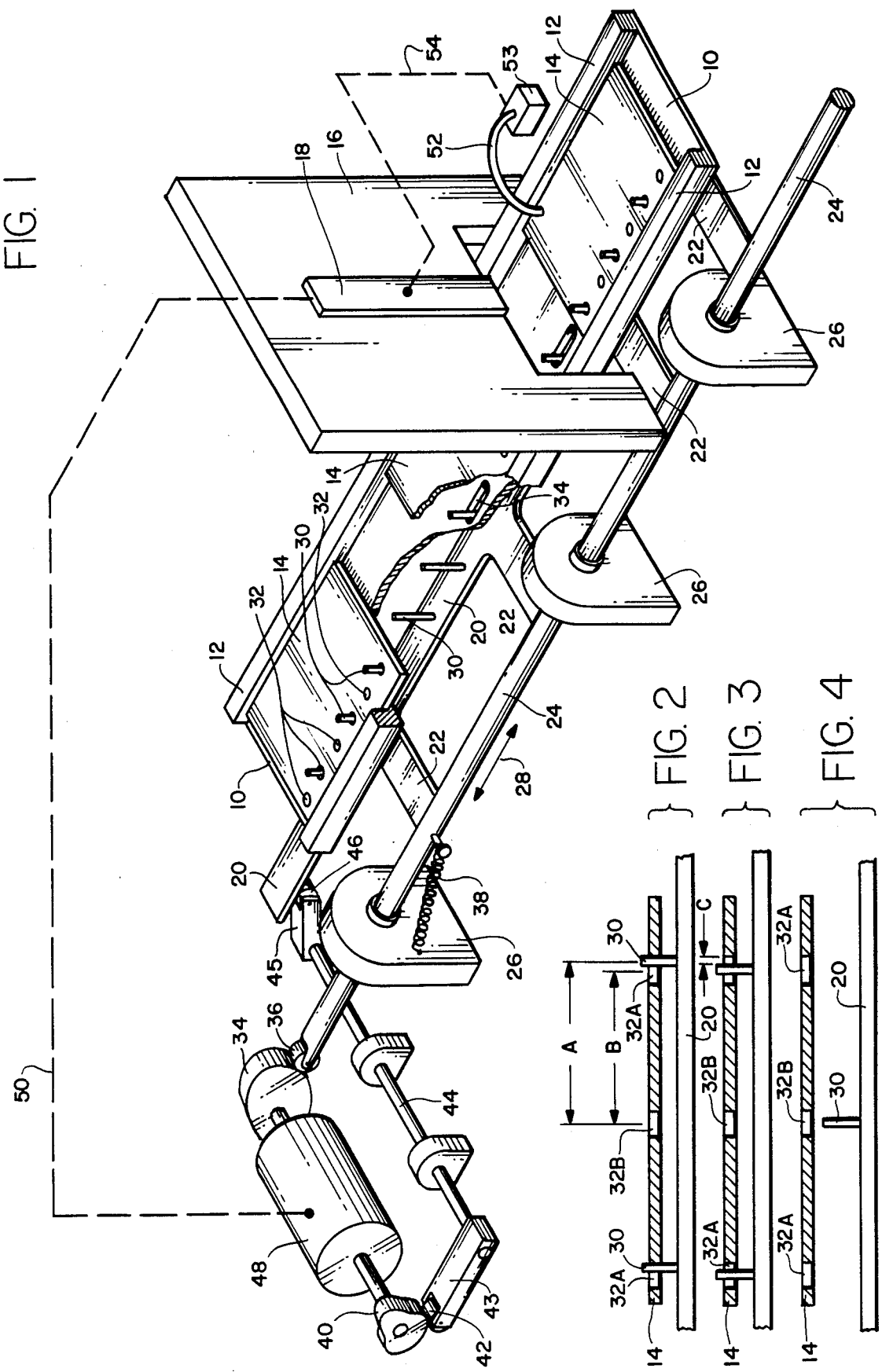

DISCRETE STRIP TAPER

This application is a continuation of application Ser. No. 463,790 filed 2/4/83, now abandoned.

BACKGROUND OF THE INVENTION

This invention relates to machines to apply tape to the leads of lead frames for semiconductor packages so as to secure those leads, which are quite fragile, during processing. Such a machine is described in detail in U.S. Pat. No. 4,193,834. The invention herein comprises an improved mechanism to feed lead frame, particularly lead frame that has already been cut into discrete lengths, into a machine of the type described in that patent. Accordingly, the teachings and drawings of U.S. Pat. No. 4,193,834 are hereby incorporated by reference into this specification and will be referred to from time to time.

When lead frame is supplied in a continuous strip off a reel, such as reel 22 in the earlier referenced patent, it may be advanced by a single mechanism such as the spring loaded pins 206 and 208 that are moved by a carrier block 186 and tilted into holes in the lead frame by a tilt plate 207 in the referenced patent. As therein taught, the strip is clamped during pin retraction and back stroke by a clamp 218. Since the strip is continuous, clamp 218 generally locates the strip along its entire length and guarantees accurate positioning.

However, once one cuts the lead frame into individual discrete strips, which is advantageous for manufacturing reasons, several new problems arise with respect to advancing or indexing these discrete strips into the taping portion of the machine. The indexing mechanism must now engage each and every one of the discrete pieces wherever they are along the feedpath. Also, since each piece is very light, compared to a continuous strip of uncut lead frame, and therefore easily moved, the indexing mechanism must be designed so that it does not itself accidentally nudge the pieces out of position, especially in the taping portion of the machine where accuracy is very important. Still further, the discrete pieces of lead frame advance through the taping portion with spaces between them of unpredictable length. So means must be provided to prevent the application of tape when no lead frame is present in the tape applying portion. The present invention solves these problems.

SUMMARY OF THE INVENTION

Briefly the present invention contemplates a feed mechanism utilizing a movable support bar that extends the length of the machine. A series of evenly spaced pins extends up from the support bar, through slots in the surface upon which the lead frames slide, and into holes in the edge of the lead frames. The pins are not sized to match the holes, as in the prior art, but rather are intentionally made substantially smaller than the holes so as to be able to move in and out of the holes without contacting the edges of the holes. The support bar and the pins are then cycled through a special sequence of movements arranged to insert the pins at a location in the center of the holes, move the pins forward against the edges of the holes so as to advance the lead frames, retreat the pins a short distance back to the center of the holes, and then withdraw the pins without contacting the edges of the holes. Then the support bar and pins return to the start position to re-enter the next set of holes at their center locations. The special sequence of movements is created by two carefully shaped and coordinated cams.

BRIEF DESCRIPTION OF THE DRAWINGS

FIG. 1 shows in simplified form the main elements of the discrete strip feed mechanism in a generally perspective view.

FIGS. 2, 3, and 4 show a sectional view of a small portion of the feed path at three successive points in time to demonstrate the motion of the drive pins as they enter and leave the holes only at the center of the holes.

DESCRIPTION OF THE PREFERRED EMBODIMENT

FIG. 1 shows a guide and support track 10 with raised side rails 12. The discrete pieces of lead frame 14 slide on the surface of track 10, between rails 12, into and under a tape applying portion 16. Taping portion 16 is shown only schematically in FIG. 1, along with a representation of the actuating portion 18, but could comprise a mechanism essentially identical to that shown in the above referenced patent.

A pin support bar 20 extends the length of track 10 and includes several side extensions 22 that fasten to a shaft 24. Shaft 24 is carried in dual acting bearings 26 so that shaft 24 is free to move axially, as shown by arrows 28, and rotationally about its axis. When shaft 24 rotates, bar 20 and pins 30, move up and down, the pins entering a series of holes 32 that are present in the edge of the lead frames 14. Slots 34 in track 10 permit the pins 30 to pass through track 10 and enter holes 32.

Pins 30 are evenly spaced along bar 20 at intervals corresponding to every other hole 32. When shaft 24 moves axially, in bearings 26, the pins 30 slide lead frames 14 along track 10. Such axial movement is generated by a cam 34 acting on a cam follower 36 at the end of shaft 24. Return axial motion is effected by a spring 38.

The up and down motion of bar 20 is generated by a cam 40, through a suitable bell crank linkage comprising a roller 42, arm 43, shaft 44, arm 45, and roller 46, against the restraining force of either gravity or a suitable spring. Cams 34 and 40 are both driven by any suitable drive mechanism 48, which in the preferred embodiment comprises a mechanical drive, such as a gear train, connected by a drive shaft (shown schematically with dashed line 50) back to the drive mechanisms of the tape applying portion. In the above referenced patent, the drive shaft 50 may be conveniently connected to drive sprocket 88 shown in FIG. 4.

Cams 34 and 40 are carefully shaped to cycle the movements of pins 30 through a special sequence that assures the accurate positioning of lead frames 14. FIGS. 2-4 show successive fragmentary views of a section of the bar 20 and lead frame 14. In FIG. 2, pins 30 are at the end of an advancing stroke (to the right) of length A that has advanced lead frame 14 to the right along track 10. The pins are inside every other hole 32A. Since the hole spacing is a distance B, the pin spacing is 2B. Before cam 40 allows bar 20 to drop and withdraw pins 30, cam 34 allows shaft 24 to retreat a small clearance distance C so that the pins return to the center of the holes as shown in FIG. 3. At that time, cam 34 is flat for awhile while cam 40 allows the pins to drop out of the holes without any sliding contact against the side of the holes. Hence, lead frames 14 remain in the proper position and are not accidentally nudged by the withdrawing pins. Once the pins 30 are fully lowered by cam 40, the cam 34 allows the pins to back up a distance B to the position shown in FIG. 4. Here the pins are centered in the holes (this time holes 32B), so that cam 40 can again lift the pins into the holes with no danger of bumping into the sides of the holes. Upon reentry, cam 34 can move shaft 24 and pins 30 to the right a distance A to again appear as in FIG. 2.

Returning to FIG. 1, it will be noticed that spaces must exist between the lead frames 14 as they progress along track 10. To prevent the application of tape when one of these spaces is below actuating portion 18, a detecting means such as a light tube 52 and reflection detector 53 is provided so as to stop the mechanism 18 with a suitable disabling means (shown only schematically by dashed line 54) whenever no lead frame is present. In the above referenced patent, for example, the advance of tape may be halted or disabled simply by using electrically activated brakes to stop rollers 56 and 58 from moving the tape. Rollers 56 and 58 are driven by the spring return of bars 96 and 98 (FIG. 4) working through one-way clutches. Thus, the rest of the machine can keep running as desired.

I claim:

1. Apparatus for applying a securing tape to a lead frame having longitudinal locator hole rows arrayed along the edges thereof, said apparatus comprising:

a feeding means for advancing discrete pieces of lead frame into a tape-applying portion of said apparatus;

taping means located at said tape-applying portion for applying securing tape elements to said lead frame;

a guide and support surface adapted to accept said discrete pieces of lead frame thereon for sliding support, said lead frame pieces being guided thereby into position in the tape applying portion said guide and support surface including a plurality of slots located in registry with the locator holes associated in the lead frame being transported;

pin means comprising a plurality of pins adapted to extend through said slots and enter said locator holes in said lead frame pieces, said pins being substantially smaller than the locator holes they enter, so as to maintain a clearance between the pins and the locator holes;

pin support means holding said pins at spacings corresponding to the spacings of every other hole in the lead frame pieces; and means for moving said pin support means so that said pins can be moved into and out of the plane of said lead frame pieces and so that said pins can be translated along the direction of said locator hole rows;

actuating means connected to move said pin support means, and thus said pin means, first into the holes in the lead frame pieces, then along said guide and support surface a distance equal to the sum of the spacing between the holes in the lead frame pieces and the clearance between the pins and the edges of the holes, so as to move the lead frame pieces toward the tape applying portion, then in the reverse direction along said guide a distance substantially equal to the clearance between the holes and the pins therein, thereby to establish clearance between the lead frame holes and the pins, then out of the holes in the lead frame pieces, and then in the reverse direction a distance equal to the spacing of the holes so as to be in a position to reenter the holes, upon repeat of the movement cycle, without contacting the edges of the holes.

2. The apparatus of claim 1 in which said pin support means comprises a member extending along said guide and support surface so as to hold pins along the length of the surface in order to engage and move several different discrete lead frame pieces at the same time.

3. The apparatus of claim 1 in which said moving means comprises a shaft connected to the pin support means, said shaft supported by bearings that allow axial movement of said shaft parallel to the guide and support surface and also rotational movement to move the pins on the pin support means in and out of the holes in the lead frame pieces, said axial movment effected by a first cam means acting on the end of the shaft, and said rotational movement effected by a cam means acting on the pin support means.

4. The apparatus of claim 1 including detecting means to sense if no discrete piece of lead frame is in position in the tape applying portion to receive securing tape, and disabling means connected to said detecting means operable to prevent the application of tape when no lead frame is in position to receive same.

5. The apparatus of claim 3 in which said pin support means comprises a member extending along said guide and support surface so as to hold pins along the length of the surface in order to engage and move several different discrete lead frames at the same time.

6. The apparatus of claim 5 including detecting means to sense if no discrete piece of lead frame is in position in the tape applying portion to receive securing tape, and disabling means connected to said detecting means operable to prevent the application of tape when no lead frame is in position to receive same.

* * * * *